United States Patent
Huang et al.

(10) Patent No.: US 7,514,287 B2
(45) Date of Patent: Apr. 7, 2009

(54) METHOD OF FORMING A CAVITY BY TWO-STEP ETCHING AND METHOD OF REDUCING DIMENSION OF A MEMS DEVICE

(75) Inventors: Ter-Chang Huang, Chia-Yi Hsien (TW); Hung-Yi Lin, Tao-Yuan Hsien (TW); Wen-Syang Hsu, Hsin-Chu (TW)

(73) Assignee: Touch Micro-System Technology Inc., Yangmei Township, Taoyuan County (TW)

( * ) Notice: Subject to any disclaimer, the term of this patent is extended or adjusted under 35 U.S.C. 154(b) by 412 days.

(21) Appl. No.: 11/308,303

(22) Filed: Mar. 15, 2006

(65) Prior Publication Data

US 2007/0077727 A1  Apr. 5, 2007

(30) Foreign Application Priority Data

Oct. 3, 2005  (TW) ............................... 94134518 A

(51) Int. Cl.
*H01L 21/00* (2006.01)

(52) U.S. Cl. ................................. 438/53; 257/E21.613
(58) Field of Classification Search .................. 438/53; 257/E21.613

See application file for complete search history.

(56) References Cited

U.S. PATENT DOCUMENTS 6,156,585 A * 12/2000 Gogoi et al. .................. 438/48
2004/0056560 A1 * 3/2004 Wang et al. .................. 310/311

* cited by examiner

*Primary Examiner*—Lex Malsawma
(74) *Attorney, Agent, or Firm*—Winston Hsu

(57) ABSTRACT

A method for reducing dimension of an MEMS device. A single crystalline substrate having a diaphragm is provided. A first-step anisotropic dry etching process is performed to form an opening corresponding to the diaphragm in the back surface, the anisotropic dry etching stopping on a specific lattice plane extending from the edge of the diaphragm. A second-step anisotropic wet etching process is performed to etch the single crystalline substrate along the specific lattice plane until the diaphragm is exposed to form a cavity having a diamond-like shape.

14 Claims, 5 Drawing Sheets

US 7,514,287 B2

METHOD OF FORMING A CAVITY BY TWO-STEP ETCHING AND METHOD OF REDUCING DIMENSION OF A MEMS DEVICE

BACKGROUND OF THE INVENTION

1. Field of the Invention

The present invention relates to a method of forming a cavity by two-step etching, and more particularly, to a method of forming a cavity having a diamond-like shape by two-step etching that can effectively reduce the dimension of a MEMS device.

2. Description of the Prior Art

Refer to FIG. 1. FIG. 1 is a schematic diagram of a conventional piezoresistive pressure sensor. As shown in FIG. 1, the conventional piezoresistive pressure sensor 10 includes a single crystalline silicon substrate 12, a diaphragm 14 disposed on the front surface of the single crystalline silicon substrate 12, a plurality of piezoresistors 16 formed in the diaphragm 14, and a cavity (back chamber) 18 formed on the back surface of the single crystalline silicon substrate 12. The cavity 18 enables the diaphragm 14 to be suspended, so that the diaphragm 14 can provide a pressure-sensing function. It is appreciated that the cavity 18 of the conventional piezoresistive pressure sensor 10 is directly formed by an anisotropic wet etching process. This anisotropic wet etching process etches the lattice plane (1,0,0) of the single crystalline silicon substrate 12, and the etching will stop at the lattice plane (1,1,1). Accordingly, the cavity 18 has an inclined sidewall.

The dimension A of the conventional piezoresistive pressure sensor 10 is decided by the size B of the bottom bonding region, the size C of the lattice projection plane, and the size D of the diaphragm 14. Specifically, A=2B+2C+D. However, the inclined sidewall of the cavity 18 is caused due to the anisotropic wet etching process, and the size C of the lattice projection plane is redundant. This redundant size C is not functional for the piezoresistive pressure sensor 10, but wastes the available areas on the single crystalline silicon substrate 12.

SUMMARY OF THE INVENTION

It is therefore one of the objectives of the claimed invention to provide a method of form a cavity by two-step etching and reducing the dimension of a MEMS device to improve the integration.

According to the claimed invention, a method of forming a cavity by two-step etching is provided. First, a single crystalline silicon substrate is provided. Then, a bottom region of the cavity to be formed is decided, and a first-step anisotropic dry etching process is performed to etch the single crystalline silicon substrate to form an opening, the opening having a vertical sidewall. The etching of the single crystalline silicon substrate stops on a specific lattice plane extending from edges of the bottom region. Subsequently, a second-step anisotropic wet etching process is performed to etch the single crystalline silicon substrate along the specific lattice plane until the bottom region is exposed to form the cavity.

According to the claimed invention, a method of reducing a dimension of a MEMS device is provided. First, a single crystalline silicon substrate having a diaphragm disposed on a front surface is provided. Then, a first-step anisotropic dry etching process is performed to etch a back surface of the single crystalline silicon substrate to form an opening corresponding to the diaphragm. The etching of the single crystalline silicon substrate stops on a specific lattice plane extending from edges of the diaphragm. Subsequently, a second-step anisotropic wet etching process is performed to etch the single crystalline silicon substrate along the specific lattice plane until the diaphragm is exposed to form a cavity. The cavity has a diamond-like shape.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
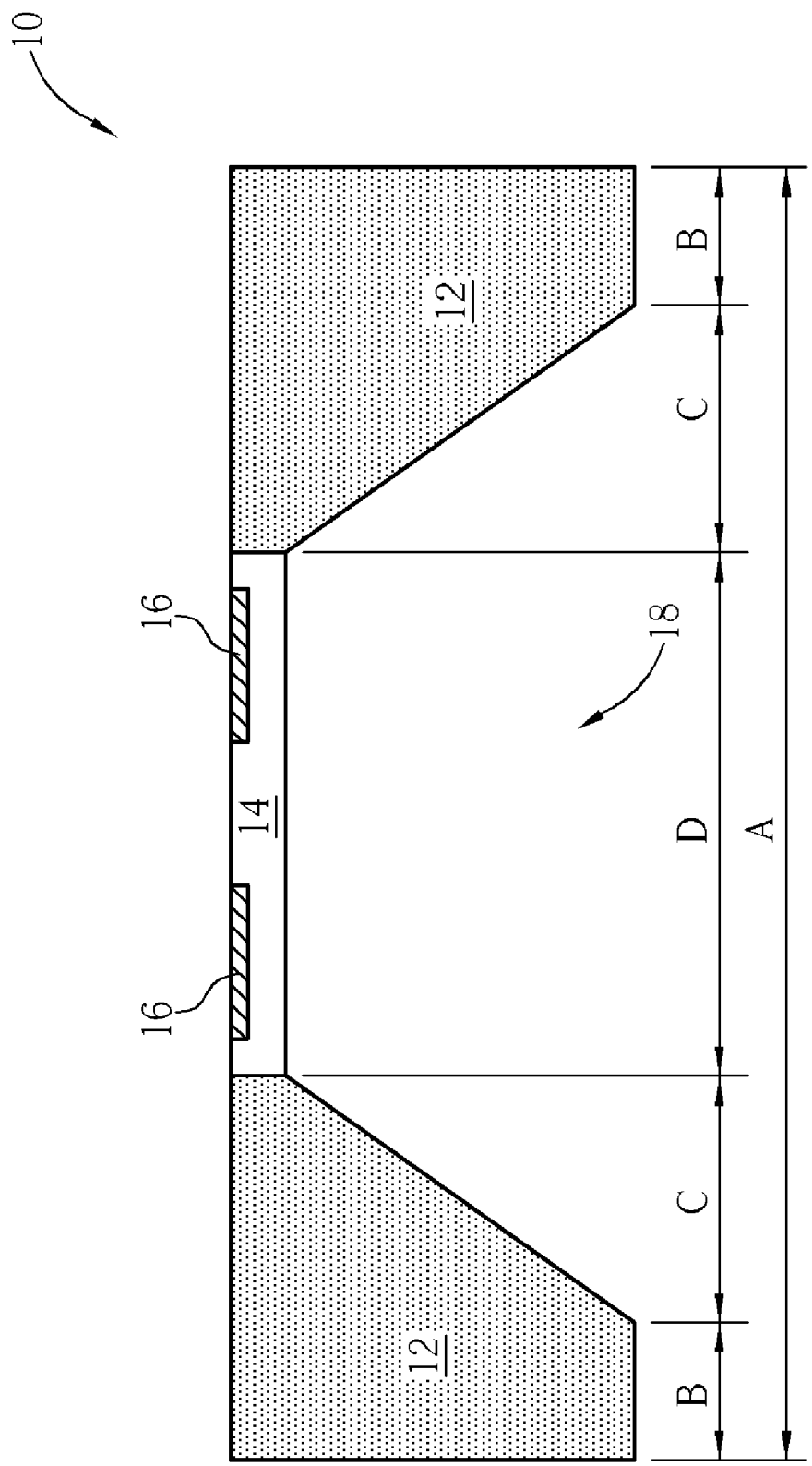
FIG. 1 is a schematic diagram of a conventional piezoresistive pressure sensor.
Figure 2:
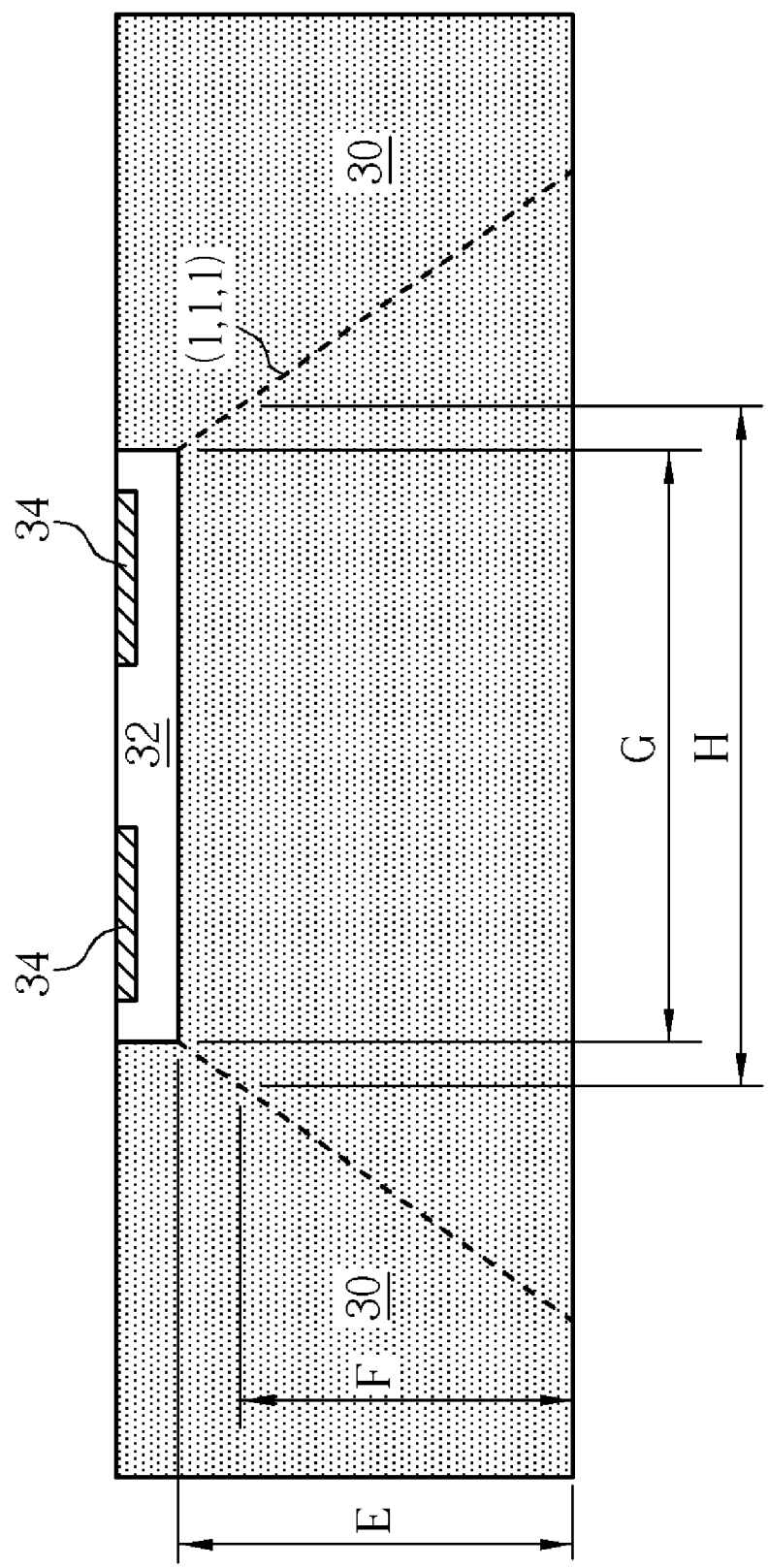
FIG. 2 to FIG. 5 are schematic diagrams illustrating a method of reducing a dimension of a MEMS device according to a preferred embodiment of the present invention.

Refer to FIG. 2 to FIG. 5. FIG. 2 to FIG. 5 are schematic diagrams illustrating a method of reducing a dimension of a MEMS device according to a preferred embodiment of the present invention. According to the method of the present invention, the cavity of the MEMS device is accomplished by two-step etching, and only a single piezoresistive pressure sensor is illustrated for highlighting the feature of the present invention. As shown in FIG. 2, a single crystalline silicon substrate 30 e.g. a single crystalline silicon wafer is provided. The single crystalline silicon substrate 30 has a specific lattice orientation such as (1,0,0). The single crystalline silicon substrate 30 includes a diaphragm 32 disposed on the front surface, and a plurality of piezoresistors 34 formed in the diaphragm 32 to convert pressure signals into voltage signals. For a piezoresistive pressure sensor, the piezoresistors 34 are connected as a Wheaston bridge so as to amplify voltage signals.

Figure 3:
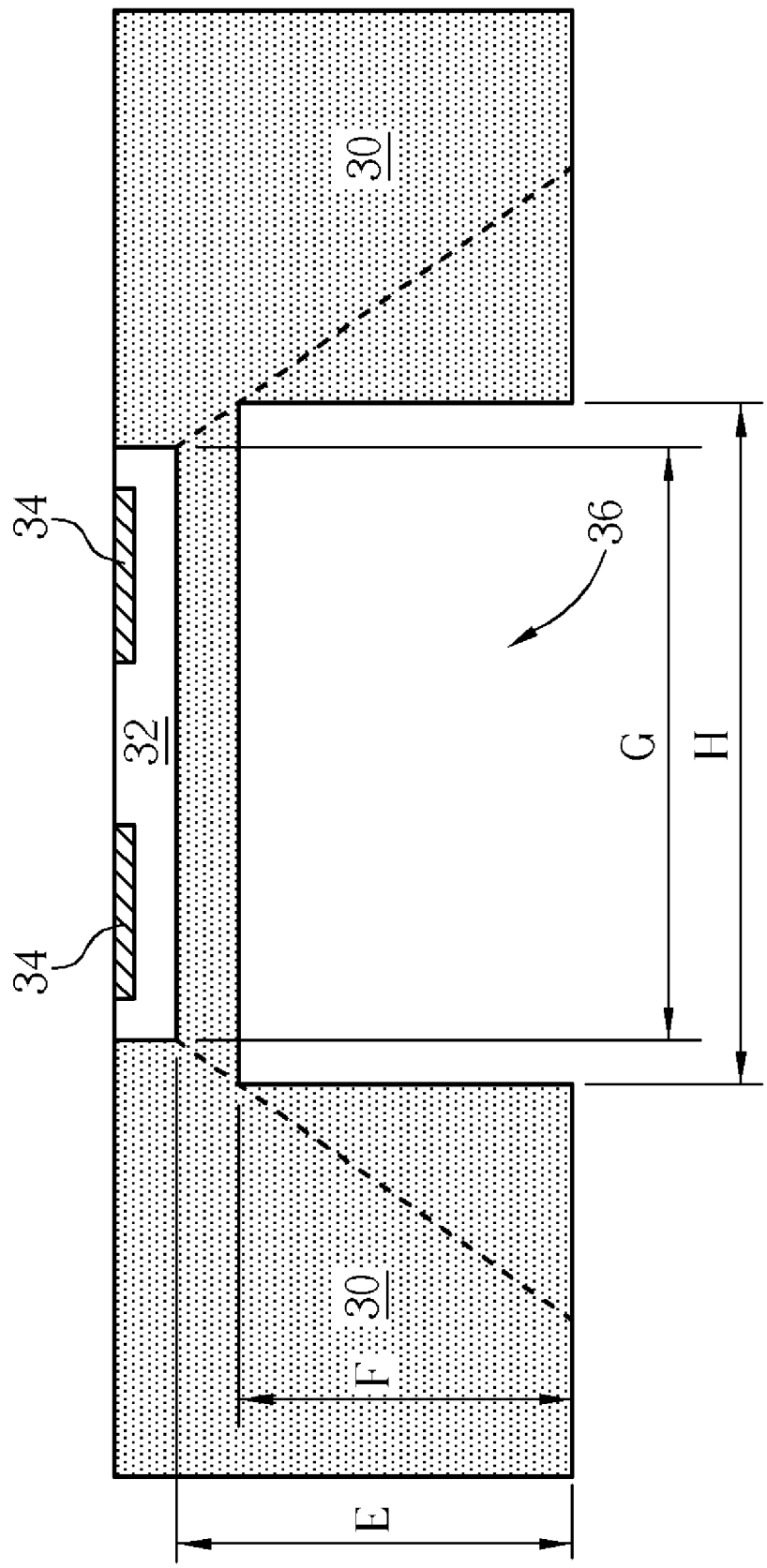

The diaphragm 32 has a bottom size G, and the distance between the back surface of the single crystalline silicon substrate 30 and the bottom of the diaphragm 32 is E. The bottom size G is the bottom size of the cavity to be formed, and the distance E is the depth of the cavity to be formed. Subsequently, a specific lattice plane extending from the bottom of the diaphragm 32 is calculated. In this embodiment, the specific lattice plane is (1,1,1), and an opening size H and an opening depth F are decided. The opening size H is slightly larger than the bottom size G of the diaphragm 32, and the opening depth F is decided according to the lattice plane (1,1,1). As shown in FIG. 3, a first-step anisotropic dry etching process is performed to etch the single crystalline silicon substrate 30 basing on the opening size H and the opening depth F, so as to form an opening 36 with a vertical sidewall. In this embodiment, the first-step anisotropic dry etching process can be a deep X-ray lithography process, or a plasma etching process such as a reactive ion etching (RIE) process, an inductively coupled plasma reactive ion etching (ICPRIE) process, or an electron cyclotron resonance (ECR) plasma etching process.

Figure 4:
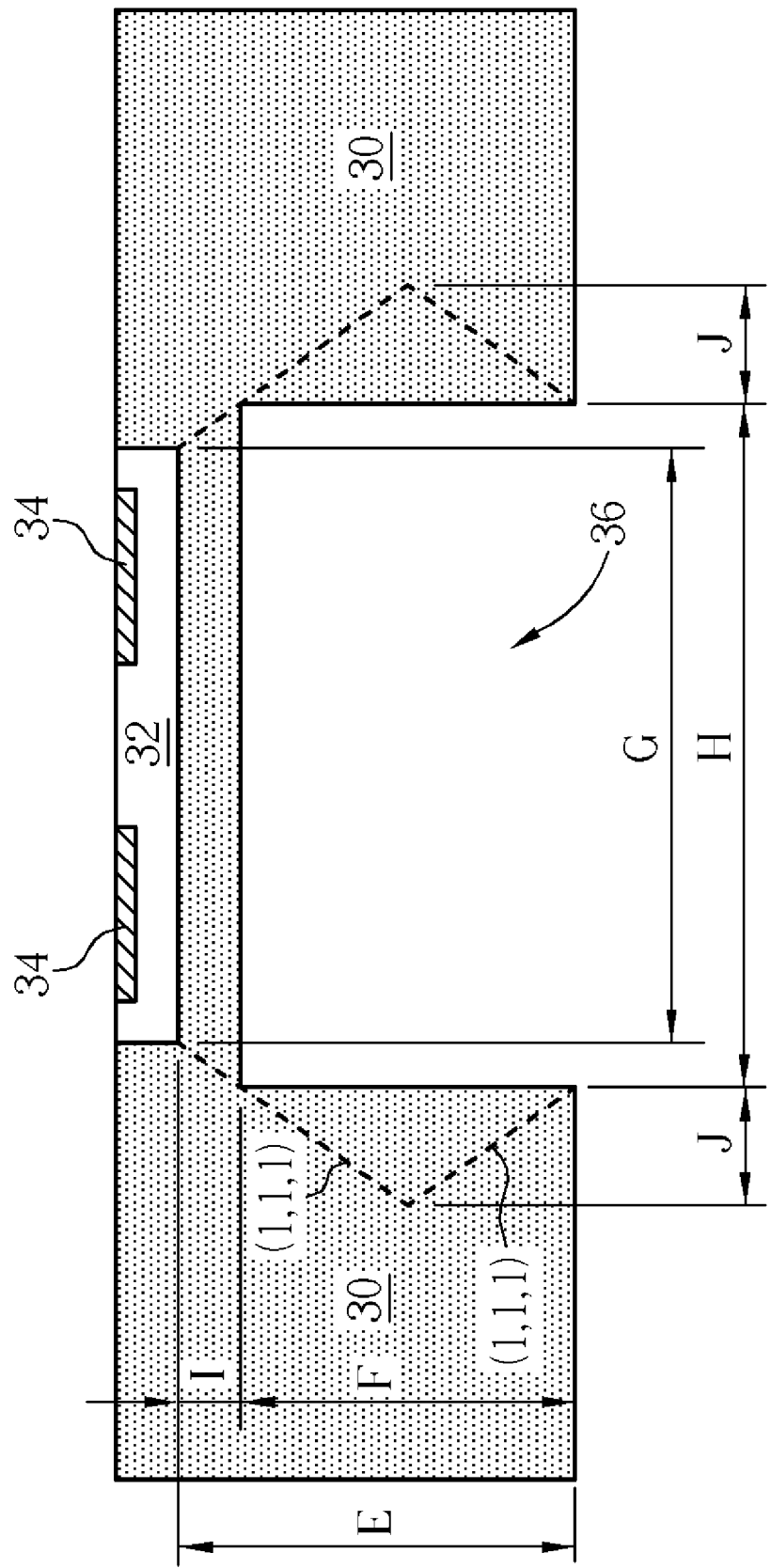
Figure 5:
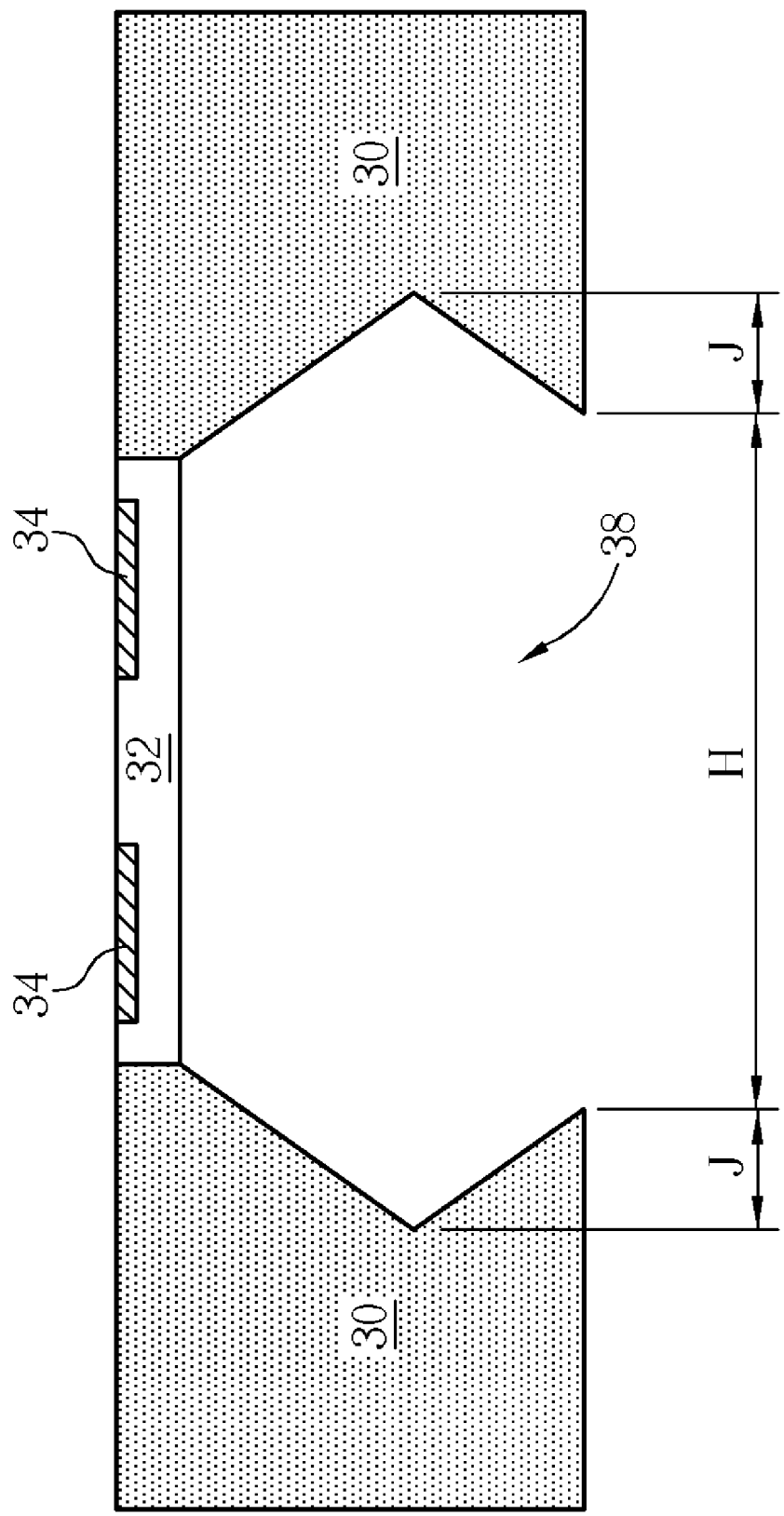

As shown in FIG. 4, a vertical distance I and a horizontal distance J to be etched in a second-step anisotropic wet etching process to be performed are calculated. The vertical distance I equals to the distance E minus the opening depth F, and the horizontal distance J equals to the distance extending from the sidewall of the opening 36 formed in the first-step anisotropic dry etching process to the lattice plane (1,1,1). As shown in FIG. 5, a second-step anisotropic wet etching process is performed to vertically etch the single crystalline silicon substrate 30 according to the vertical distance I until the bottom of the diaphragm 34, and also horizontally etch the single crystalline silicon substrate 30 according to the horizontal distance J until the lattice plane (1,1,1). As a result, a cavity 38 having a diamond-like shape is formed.

In this embodiment, the second-step anisotropic wet etching process is achieved by using solutions such as potassium hydroxide (KOH), an ethylenediamine-pyrocatechol-water (EDP) or tetramethyl ammonium hydroxide (TMAH). These solutions can accurately control the etching of the single crystalline silicon substrate 30 to stop on the lattice plane (1,1,1) so that the cavity 38 has a diamond-like shape. Specifically, the Included angle between the sidewall of the cavity 38 and the back surface of the cavity 38 in this embodiment is approximately 54.7 degrees. It is appreciated that other solutions having the same effect can also be used to form the cavity 38. It can be seen that the cavity 38 formed by two-step etching has a diamond-like shape, and the actual dimension of the cavity 38 equals to the opening size H plus two times the horizontal distance J, i.e. H+2J. Therefore, the dimension of the MEMS device is reduced.

In brief, the method of the present invention uses two-step etching to form the cavity of the MEMS device, and thus the device integration is improved. It is appreciated that the method of the present invention is not limited to form MEMS devices, and can be used to form any cavity or trench structures. In addition, the MEMS device is not limited to a piezoresistive pressure sensor, and can be any device having a cavity or back chamber such as a piezoresistive accelerator or a microphone device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a cavity by two-step etching, comprising:
    providing a single crystalline silicon substrate;
    deciding a bottom region of the cavity to be formed;
    performing a first-step anisotropic dry etching process to etch the single crystalline silicon substrate to form an opening, the opening having a vertical sidewall, the etching of the single crystalline silicon substrate stopping on a specific lattice plane extending from edges of the bottom region; and
    performing a second-step anisotropic wet etching process subsequent to the first-step anisotropic dry etching process to etch the single crystalline silicon substrate along the specific lattice plane until the bottom region is exposed to form the cavity, wherein the cavity has a barrel-like shape subsequent to the second-step anisotropic wet etching process.

2. The method of claim 1, wherein a minimum dimension of the barrel-like shape is located in an upper opening or in a bottom opening of the barrel-like shape, and a maximum dimension of the barrel-like shape is located between the upper opening and the bottom opening.

3. The method of claim 1, wherein a lattice orientation of the single crystalline silicon substrate is (1,0,0), and the specific lattice plane is (1,1,1).

4. The method of claim 1, wherein the first-step anisotropic dry etching process is a plasma etching process.

5. The method of claim 4, wherein the plasma etching process comprises a reactive ion etching process, an inductively coupled plasma reactive ion etching process, or an electron cyclotron resonance plasma etching process.

6. The method of claim 1, wherein the plasma etching process comprises a deep X-ray lithography process.

7. The method of claim 1, wherein the second-step anisotropic wet etching process is achieved by potassium hydroxide, an ethylenediamine-pyrocatechol-water or tetramethyl ammonium hydroxide.

8. A method of reducing a dimension of a MEMS device, comprising:
    providing a single crystalline silicon substrate having a diaphragm disposed on a front surface;
    performing a first-step anisotropic dry etching process to etch a back surface of the single crystalline silicon substrate to form an opening corresponding to the diaphragm, the etching of the single crystalline silicon substrate stopping on a specific lattice plane extending from edges of the diaphragm; and
    performing a second-step anisotropic wet etching process subsequent to the first-step anisotronic dry etching process to etch the single crystalline silicon substrate along the specific lattice plane until the diaphragm is exposed to form a cavity, the cavity having a barrel-like shape subsequent to the second-step anisotropic wet etching process.

9. The method of claim 8, wherein the MEMS device comprises a piezoresistive pressure sensor.

10. The method of claim 8, wherein a lattice orientation of the single crystalline silicon substrate is (1,0,0), and the specific lattice plane is (1,1,1).

11. The method of claim 8, wherein the first-step anisotropic dry etching process is a plasma etching process.

12. The method of claim 11, wherein the plasma etching process comprises a reactive ion etching) process, an inductively coupled plasma reactive ion etching process, or an electron cyclotron resonance plasma etching process.

13. The method of claim 8, wherein the plasma etching process comprises a deep X-ray lithography process.

14. The method of claim 8, wherein the second-step anisotropic wet etching process is achieved by potassium hydroxide, an ethylenediamine-pyrocatechol-water or tetramethyl ammonium hydroxide.

* * * * *